(12) United States Patent
Ro et al.

(10) Patent No.: US 8,124,530 B2
(45) Date of Patent: Feb. 28, 2012

(54) METHOD OF PREVENTING GENERATION OF ARC DURING RAPID ANNEALING BY JOULE HEATING

(75) Inventors: Jae-Sang Ro, Seoul (KR); Won-Eui Hong, Seoul (KR)

(73) Assignee: Ensiltech Corporation (KR)

( * ) Notice: Subject to any disclaimer, the term of this patent is extended or adjusted under 35 U.S.C. 154(b) by 539 days.

(21) Appl. No.: 12/304,072

(22) PCT Filed: Jan. 10, 2007

(86) PCT No.: PCT/KR2007/000190
§ 371 (c)(1),
(2), (4) Date: Dec. 9, 2008

(87) PCT Pub. No.: WO2007/142399
PCT Pub. Date: Dec. 13, 2007

(65) Prior Publication Data
US 2010/0233858 A1 Sep. 16, 2010

(30) Foreign Application Priority Data
Jun. 9, 2006 (KR) .................. 10-2006-0052009

(51) Int. Cl.
*H01L 21/44* (2006.01)
(52) U.S. Cl. ................. 438/663; 257/E21.454
(58) Field of Classification Search .......... 438/663, 438/FOR. 242, FOR. 407; 257/E21.454
See application file for complete search history.

(56) References Cited

U.S. PATENT DOCUMENTS

| 5,514,229 | A | * | 5/1996 | Parkansky et al. | ............ 148/566 |
| 5,795,631 | A | * | 8/1998 | Parkansky et al. | ........... 428/34.1 |
| 6,297,080 | B1 | | 10/2001 | Lee et al. | |
| 6,482,721 | B1 | | 11/2002 | Lee | |

FOREIGN PATENT DOCUMENTS

| CN | 1795563 | 6/2006 |
| JP | 2007-502025 | 2/2007 |
| KR | 10-2000-0031708 | 6/2000 |
| KR | 1020000031709 | 6/2000 |
| KR | 10-2000-0041015 | 7/2000 |
| KR | 10-2000-0065442 | 11/2000 |
| KR | 10-2002-0031835 | 5/2002 |
| KR | 1020020031835 | 5/2002 |
| KR | 10-2004-0102350 | 12/2004 |

(Continued)

OTHER PUBLICATIONS

Second Chinese Office Action-Chinese Application No. 200780021200.3 issued Jun. 23, 2010.

(Continued)

*Primary Examiner* — Michelle Estrada
(74) *Attorney, Agent, or Firm* — Cantor Colburn LLP

(57) ABSTRACT

Disclosed herein is a rapid annealing method in a mixed structure composed of a heat treatment-requiring material, dielectric layer and conductive layer, comprising that during rapid annealing on a predetermined part of the heat treatment-requiring material, by instantaneously generated intense heat due to Joule heating by application of an electric field to the conductive layer, the potential difference between the heat treatment-requiring material and the conductive layer is set lower than the dielectric break-down voltage of the dielectric layer, thereby preventing generation of arc by dielectric breakdown of the dielectric layer during the annealing.

36 Claims, 15 Drawing Sheets

FOREIGN PATENT DOCUMENTS

WO   2004/107453   12/2004
WO   2006031017   3/2006

OTHER PUBLICATIONS

Gin-De Lee et al., Physics and Application of Dielectric Material, Sun Yet-Sen University publisher, 1992.

International Search Report—PCT/KR2007/000190 dated Apr. 12, 2007.

Written Opinion—PCT/KR2007/000190 dated Apr. 12, 2007.

PCT International Preliminary Report on Patentability; International Application No. PCT/KR2007/000190; Date of Issuance of Report: Dec. 10, 2008.

Ro et al; "Millisecond Crystallization of Amorphous Silicon Film using Joule Heating"; SID Digest; 2006; pp. 1280-1283.

Sameshima et al; "Rapid crystallization of silicon films using pulsed current-induced joule heating"; Journal of Non-Crystalline Solids; vol. 299-302; 2002; pp. 746-750.

Extended European Search Report for application No. 07708480.4 dated Jun. 24, 2009.

* cited by examiner

METHOD OF PREVENTING GENERATION OF ARC DURING RAPID ANNEALING BY JOULE HEATING

FIELD OF THE INVENTION

The present invention relates to a method of preventing generation of arc during rapid annealing by Joule heating, and more particularly, a rapid annealing method in a mixed structure composed of a heat treatment-requiring material, dielectric layer and conductive layer, comprising that during rapid annealing on a predetermined part of the heat treatment-requiring material, by instantaneously generated intense heat due to Joule heating by application of an electric field to the conductive layer, the potential difference between the heat treatment-requiring material and the conductive layer is set lower than the dielectric breakdown voltage of the dielectric layer, thereby preventing generation of arc by dielectric breakdown of the dielectric layer during the annealing

BACKGROUND OF THE INVENTION

Generally, an annealing method varies such as a furnace annealing using heat treatment furnace, a rapid thermal annealing (RTA) using radiant heat of halogen lamp and the like, a laser annealing using laser, a annealing using Joule heating, etc.

These annealing methods are selected adequately considering the characteristic of material and process in point of a temperature range of annealing, uniformity of annealing temperature, heating rate, cooling rate, purchase price, maintenance cost, etc. Especially, selectable heat treating methods are extremely restricted in case of requiring high temperature annealing or rapid annealing at a local region of material due to the characteristic of the material and process.

Among the above annealing methods, the laser annealing method can carry out the rapid annealing on the surface of a material, but because the possibility of annealing is decided by kinds of wavelength of laser and heat treatment-requiring material, the material able to annealing has been limited. Particularly, in case of annealing to large-size, the line beam-typed laser should be scanning repeatedly, thus problems such as non-uniformity of laser beam intensity and irradiation dosage of laser beam itself over time can be occurred. Furthermore, the method is disadvantageous in that not only the price of equipment but also maintenance cost is extremely high.

Although the RTA method is widely used in preparation process of a semiconductor, the present technology is applied only to silicon wafer of 300 mm in diameter, so that it has a limit in annealing uniformly on broader substrate than that. In addition, due to having a maximum heating rate of 400° C./sec, it is impossible to use in a process requiring higher heating rate than that.

Therefore, a lot of researches are being conducted for annealing method which may solve such problems and free from the limit of process. Among theses research, as described in KP 2004-74493 of the applicant, there is the rapid annealing method through Joule heating by application of an electric field to a conductive layer, and the above annealing method makes possible a selective rapid annealing over a desired material by means of heat conduction of an generated intense heat, and it could be expected to have much higher heating rate than that of RTA process.

However, there is a limit in application of the annealing method using Joule heating by an electric field application as well as the above application, due to having not been clearly identified the cause of physical phenomenon such as generation of arc during Joule heating.

SUMMARY OF THE INVENTION

The present invention has been made to solve the above problems, and other technical problems that have yet to be resolved.

As a result of a variety of extensive and intensive studies and experiments to solve the problems as described above, the inventors of the present invention have identified the cause of a generation of arc during Joule heating by application of an electric field to conductive layer in a mixed structure composed of heat treatment-requiring material/dielectric layer/conductive layer, and based on that, further have found out the fact that the arc is not occurred when annealing in a condition that meets a specific requirement. The present invention was completed on a basis of the above discovery.

The annealing method according to present invention in a mixed structure composed of a heat treatment-requiring material, dielectric layer and conductive layer, comprising that during rapid annealing on a predetermined part of the heat treatment-requiring material, by instantaneously generated intense heat due to Joule heating by application of an electric field to the conductive layer, the potential difference between the heat treatment-requiring material and the conductive layer is set lower than the dielectric breakdown voltage of the dielectric layer, thereby preventing generation of arc by dielectric breakdown of the dielectric layer during the annealing.

Therefore, according to the rapid annealing method of the invention, a part or whole of the heat treatment-requiring material can be annealed by Joule heating due to an electric field application to conductive layer within short time with preventing the generation of arc caused by dielectric breakdown of dielectric layer.

The above KP 2004-74493 of the applicant discloses the detailed methods of rapid annealing by Joule heating of conductive layer to annealing-target layer as one example of the heat treatment-requiring material, thus the above application is incorporated into the present invention as a reference.

Joule heating which takes place in the conductive layer by the electric field application is defined as a heating with a heat generated due to resistance of a conductive material upon flow of an electric current. The amount of energy per unit time applied to the conductive layer by Joule heating due to field application can be expressed by the following formula:

$$W = V \times I$$

In the above formula, W is defined as the amount of energy per unit time supplied by Joule heating, V as the voltage applied to both ends of the conductive layer, and I as the current. It can be seen from the above formula that as the voltage (V) increases, and/or as the current (I) increases, the amount of energy per unit time applied to the conductive layer by Joule heating also increases.

Therefore, the intense heat is generated instantly by Joule heating due to application of a strong electric field to the conductive layer, and thus generated heat is conducted through the dielectric layer, whereby the rapid annealing of annealing-target layer is carried out. However, in the process of rapid annealing, there is a case of generation of an arc.

As a result of a variety of extensive and intensive studies and experiments to the main cause of arc occurred during heat treatment by an electric field application in a mixed structure composed of the heat treatment-requiring material/dielectric layer/conductive layer, the inventors have found that the arc occurs when the potential difference between the heat treatment-requiring material and conductive layer is higher than the dielectric breakdown voltage of dielectric layer. This is wholly new discovery which have not been disclosed yet so that it is expected to bring progressive results in annealing method by application of an electric field.

The invention will be described in detail as followings.

In case where heat treatment-requiring material itself or a part of it enable to have conductivity, the potential difference occur between the conductive layer and heat treatment-requiring material in vertical direction of electric field applied to the conductive layer. In other words, the potential difference occurs along to the layered direction of heat treatment-requiring material/dielectric layer/conductive layer. Wherein, in case where the heat treatment-requiring material itself or some parts of it becomes to have conductivity, it will be made a structure of the typical capacitor as a whole. Accordingly, if the occurring potential difference exceeds the dielectric breakdown voltage of dielectric layer, then the electric current flows through the dielectric layer, and whereby the generation of arc is accompanied.

The case of the heat treatment-requiring material itself or some parts having conductivity includes, for example, a material itself or some parts composing conductive material, or a material changed to be conductive during annealing process. For example, an amorphous silicon thin film changes to polycrystalline silicon thin film due to Joule heating by application of an electric field to the conductive layer which is disposed in top or bottom with a state of dielectric layer interposed, whereby the polycrystalline silicon thin film shows the conductivity at high temperature. Therefore, when conducting Joule heating due to application of an electric field to get excellent crystal property, the arc may occur as the above described principle.

According to the methods of present invention, preferable methods to set lower the potential difference between the heat treatment-requiring material and conductive layer than the dielectric breakdown voltage of the dielectric layer are such as (i) making the potential difference between heat treatment-requiring material and conductive layer lower than the dielectric breakdown voltage of the dielectric layer during Joule heating, or (ii) raising the dielectric breakdown voltage of the dielectric layer.

More specific example of the above method (i) is further an electric field application to the heat treatment-requiring material simultaneously during Joule heating. Namely, the equipotential may be make not to occur the potential difference between the conductive layer and heat treatment-requiring material by applying an electric field to both the conductive layer and the heat treatment-requiring material.

The methods of applying an electric field to both the conductive layer and the heat treatment-requiring material include in case where the structure is composed of the heat treatment-requiring material/dielectric layer/conductive layer, a method applying an electric field by connecting electrode to each or both the heat treatment-requiring material and conductive layer, and a method applying an electric field to the conductive layer contacted with the heat treatment-requiring material by removing some parts of dielectric layer.

More specific example of the above method (ii) is raising the dielectric breakdown intensity of dielectric layer. Since the dielectric breakdown intensity of insulator is determined in primarily by an intrinsic characteristic of a material, it is applicable by selecting a material appropriately according to given conditions and in case of same kind of materials, it can be controlled by thickness of dielectric layer as the dielectric breakdown intensity increases by increasing of thickness.

These methods of raising the dielectric breakdown intensity can be more preferably used in case of having necessity not to flow electric current in the heat treatment-requiring material. In this connection, the generation of arc by the dielectric breakdown of the dielectric layer will be shown more specifically as follows.

The electric field applied to dielectric layer can be expressed by the following formula:

$$E = V'/t$$

E is defined as the electric field applied to dielectric layer, V' as the potential difference between heat treatment-requiring material and conductive layer occurred by voltage applied on both ends of conductive layer, t as the thickness of dielectric layer. Since the electric field applied to the dielectric layer is in inverse proportion to the thickness of the dielectric layer, increasing the thickness of the dielectric layer can decrease the electric field. Accordingly, it is not easy for E to exceed the value of dielectric breakdown voltage of insulator composing dielectric layer. Meanwhile, increasing of the thickness of dielectric layer could decrease Joule heating efficiency by reducing conduction heat from conductive layer to heat treatment-requiring material.

BRIEF DESCRIPTION OF THE DRAWINGS

The above and other objects, features and other advantages of the present invention will be more clearly understood from the following detailed description taken in conjunction with the accompanying drawings, in which:

FIG. 23 to FIG. 26 shows stage diagrams illustrating the manufacturing process of a bottom gate transistor according to another embodiment of the invention.

<NOTATION>

| | |
|---|---|
| 10: heat treatment-requiring material | 20: base layer |
| 30: annealing target layer | 40: dielectric layer |
| 50: conductive layer | 60: electrode |

DETAILED DESCRIPTION OF PREFERRED EMBODIMENTS

Hereinafter, the embodiments of present invention will be described in detail with reference to drawings, which are to help the understanding of the invention, however, not intended to limit the scope of the invention.

As references, in following figures and detailed descriptions thereof, the contact state of poly-layered thin film structure, such as the contact state between the conductive layer and electrode, the contact state between the heat treatment-requiring material (or annealing target layer) and electrode and the contact state between the heat treatment-requiring material and conductive layer and the like, mean keeping the contact state of such a level not to induce a large contact resistance between them during application of an electric field.

In addition, hereinafter, although the electrodes, which are added or formed to apply an electric field to the conductive layer or the heat treatment-requiring material, are expressed exclusively by addition or forming to upper surface (or top surface) in the following examples, it may include the electrodes which are added or formed to a side surface altogether, if it has a allowable structure in a poly-layered thin film structure.

Furthermore, hereinafter poly-layered thin film structures are expressed by vertical section feature, and whereby some limited expressions based on a two-dimensional explanation are using concerning with some structures (e.g., electrode), but these expressions could be changed in a three-dimensional structure.

Figure 1:
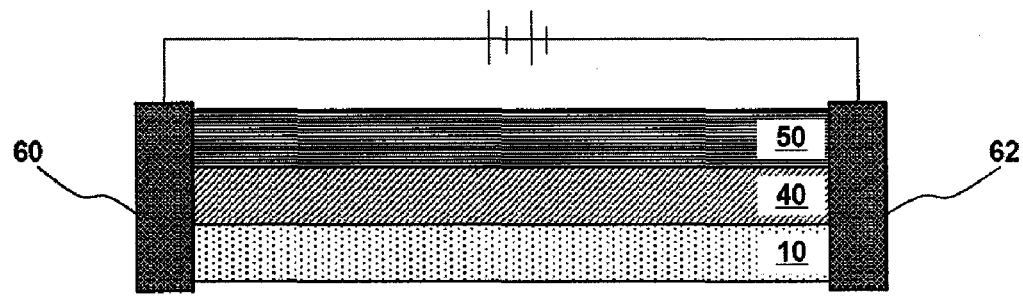
FIG. 1 shows a schematic diagram illustrating the constitution of annealing process by applying an electric field to all of the structure of conductive layer, dielectric layer and heat treatment-requiring material as a basic structure according to one embodiment of the invention.

At first, FIG. 1 shows a schematic diagram illustrating the structure of a basic specimen of the invention.

Referring to FIG. 1, after forming the dielectric layer (40) and the conductive layer (50) on the heat treatment-requiring material (10) in sequence, the electrodes which connect the heat treatment-requiring material (10) and the conductive layer (50) together are connected and an electric field is applied to the heat treatment-requiring material (10) and dielectric layer (40) simultaneously.

Due to the characteristic of process, the heat treatment-requiring material (10) are subjected to heat treatment only in the vicinity of the conductive layer (50) where Joule heating occurs actually, and thus the conductive layer (50) should be located in where requiring heat treatment of heat treatment-requiring material (10).

The heat treatment-requiring material (10) may be a various structure composed of a single material or more than 2.

The heat treatment-requiring material (10) itself or a part of it includes a material showing conductivity as the temperature rises, or a material that the direct Joule heating by applying an electric field is not preferable even if it has conductivity.

The dielectric layer (40) is used for preventing contamination able to be occurred in annealing process from the conductive layer (50) or for insulating electrically between the heat treatment-requiring material (10) and conductive layer (50) to heat locally. The dielectric layer (40) generally may be formed thin and include all kinds of material exerting little influence to the material and having an insulating property and a high melting point.

The conductive layer (50) composed a conductive material is preferable to maintain uniform thickness and chemical composition to heat uniformly during Joule heating due to an electric field application.

Applying an electric field to the conductive layer (50) may be accomplished at a room temperature and the structure may be preheated in a proper range of temperature before the electric field application. The proper range of preheating temperature means a range of temperature allowed by the heat treatment-requiring material (10) through all over the process.

The application of an electric field to the conductive layer (50) is accomplished by applying energy of power density which makes heat up to a range of desired temperature by Joule heating and determined by various factors such as specific resistance, length, thickness, width, rate of heat transmission, time of application.

The electrode (60, 62) is used as a means for the purpose to make electrical contact of the conductive layer (50) with the heat treatment-requiring material (10). Accordingly, a various means for electrical contact of the conductive layer (50) with heat treatment-requiring material (10) may be applied surely, and if the means to enable direct electrical contact between the conductive layer and heat treatment-requiring material are applied as another way or form not the way of electrode forming like what expressed in the Figures, then the electrode can be excluded. The means may include such a case of changing some structure for direct electrical contact the heat treatment-requiring material with the conductive layer in some parts, and a case where adding an optional connection member to connect electrically the heat treatment-requiring material to the conductive layer only when an electric field is applied.

Figure 2:
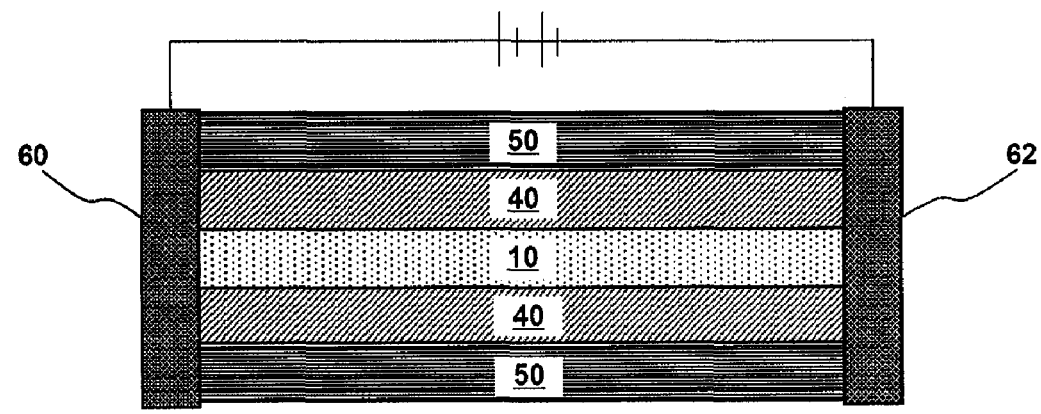
FIG. 2 shows a schematic diagram illustrating a structure according to the modified embodiment of FIG. 1.

In case where annealing the upper and lower surface of the heat treatment-requiring material (10) simultaneously, as shown in FIG. 2, a specimen may be composed of a structure of conductive layer (50)/dielectric layer (40)/heat treatment-requiring material (10)/dielectric layer (40)/conductive layer (50). In this structure, the electrode (60, 62) may be also substituted by other means connecting the conductive layer (50) with heat treatment-requiring material (10) electrically.

Therefore, unless otherwise explained from the specification, an electrode for making contact the heat treatment-requiring material ('target layer' in some cases) with conductive layer electrically may be substituted by other means to enable an electrical contact, it should be understood that all of these are also included in the scope of present invention.

Hereinafter, specimens according to embodiments having a structure of specimens of FIG. 1 as a basis structure are described more specifically by breaking into its composition and a structure of electric field application. One or more than two base layer(s) not requiring annealing due to the character of process may be added to specimens, and the heat treatment-requiring material of the specimen may be added in a form of a layer, i.e., annealing target layer.

FIG. 3 to FIG. 6 describes schematic diagrams of specimens according to a first embodiment of the invention.

Specimens (100, 101, 102, 103) according to the first embodiment composed of a structure formed in order of the target layer (30), dielectric layer (40) and conductive layer (50) on a base layer (20) and include the electrodes (60, 62) connecting to the target layer (30) and conductive layer (50).

Figure 3:
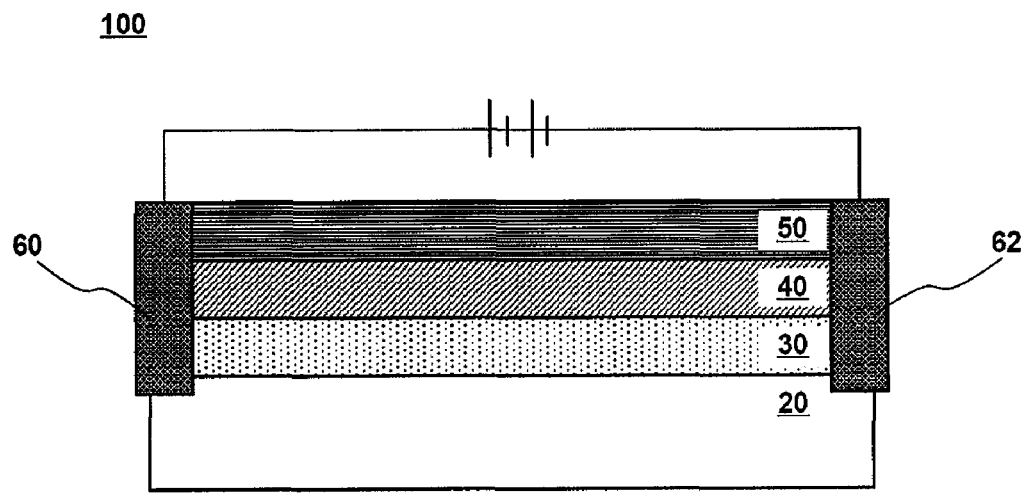
FIG. 3 to FIG. 6 show schematic diagrams illustrating specimens having the basic structure of FIG. 1, c a structure of base layer/heat treatment-requiring material/dielectric layer/conductive layer according to first embodiment, and connecting an electrode to the conductive layer and heat treatment-requiring material.
Figure 4:
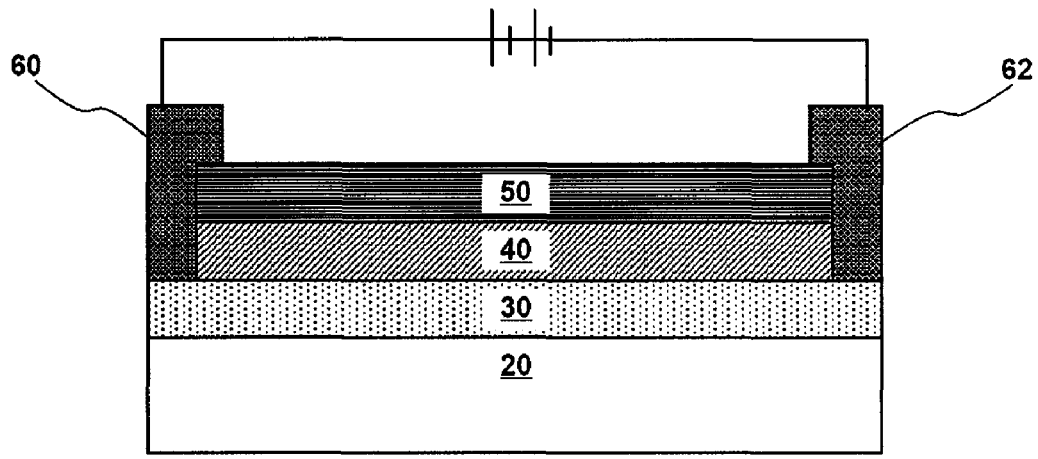

Specimens (100,101) according to the FIG. 3 and FIG. 4 comprise the layered structure of the base layer (20), target layer (30), dielectric layer (40) and conductive layer (50) in sequence, and the electrodes (60, 62) which are formed in where removing some parts of both sides of target layer (30), dielectric layer (40) and conductive layer (50) or where removing some parts of both sides of dielectric layer (40) and conductive layer (50), and the electrodes (60, 62) have a structure to contact with the target layer (30). Wherein, the electrode (60, 62) as shown in FIG. 4 may contact with both sides of upper surface of target layer (30) as a structure of covering both sides of upper surface of conductive layer (50).

Figure 5:
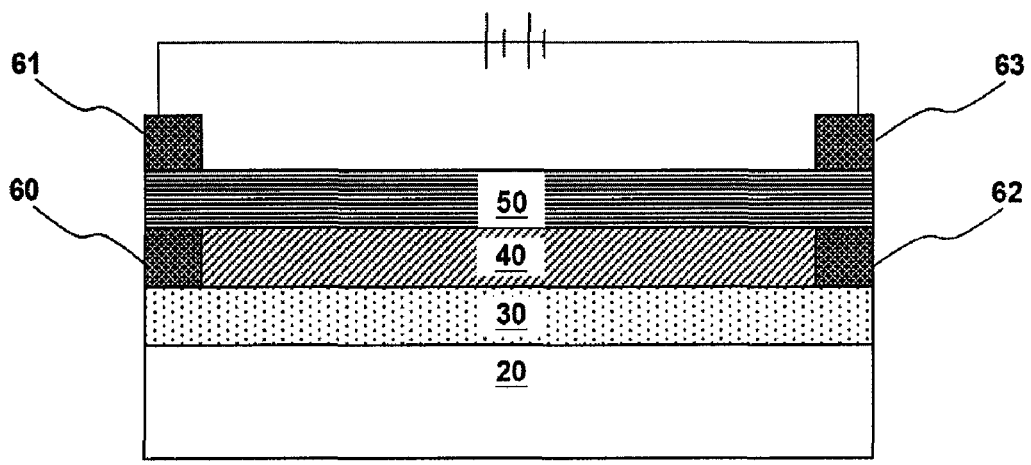
Figure 6:
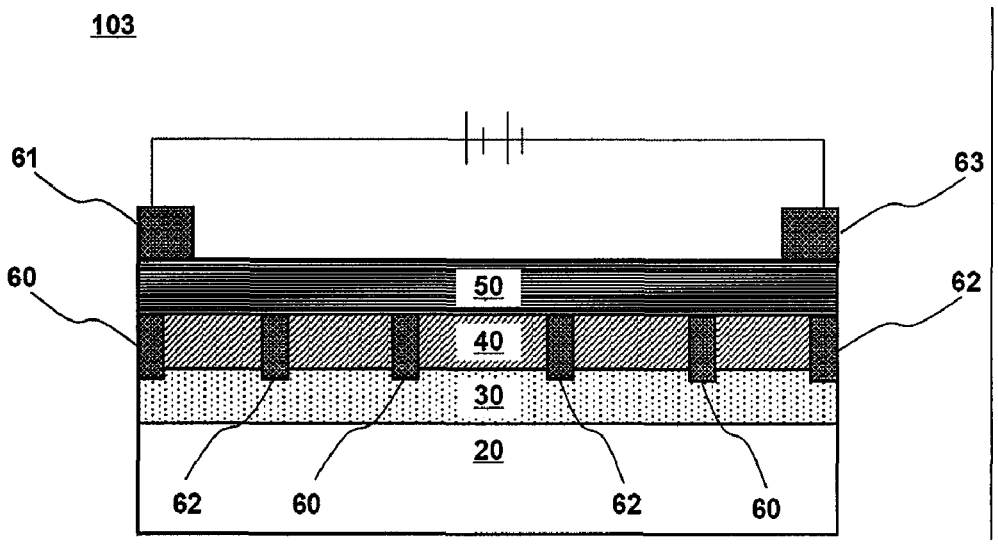

Specimens (102, 103) according to the FIG. 5 and FIG. 6 are comprised of the first electrodes (60, 62) which are formed to contact with the target layer (30) by removing some parts of dielectric layer (40) in a layered structure of base layer (20), target layer (30), dielectric layer (40); and the second electrodes (61, 63) which are formed at both sides of upper surface of conductive layer (50) formed on the dielectric layer (40) and the electrodes (60, 62).

Wherein, the target layer (30) is connected electrically with the conductive layer (50) by contacting with the first electrode (60, 62) through the parts of dielectric layer (40) removed. The dielectric layer (40) may have a structure that some parts of both sides are removed as shown in FIG. 5 or a structure that some parts are removed intermittently with a specific pattern as shown in FIG. 6.

FIG. 7 to FIG. 11 describes schematic diagrams of specimens according to a second embodiment of the invention.

Specimens (200, 201, 202, 203, 204) according to the second embodiment comprise the structure of the first dielectric layer (40), conductive layer (50), second dielectric layer (42), and target layer (30) on a base layer (20) in sequence, and include the electrodes (60, 62) connected to the target layer (30) and conductive layer (50). As the case, another base layer (22) may be formed additionally on the target layer (30) as shown in FIG. 8.

Figure 7:
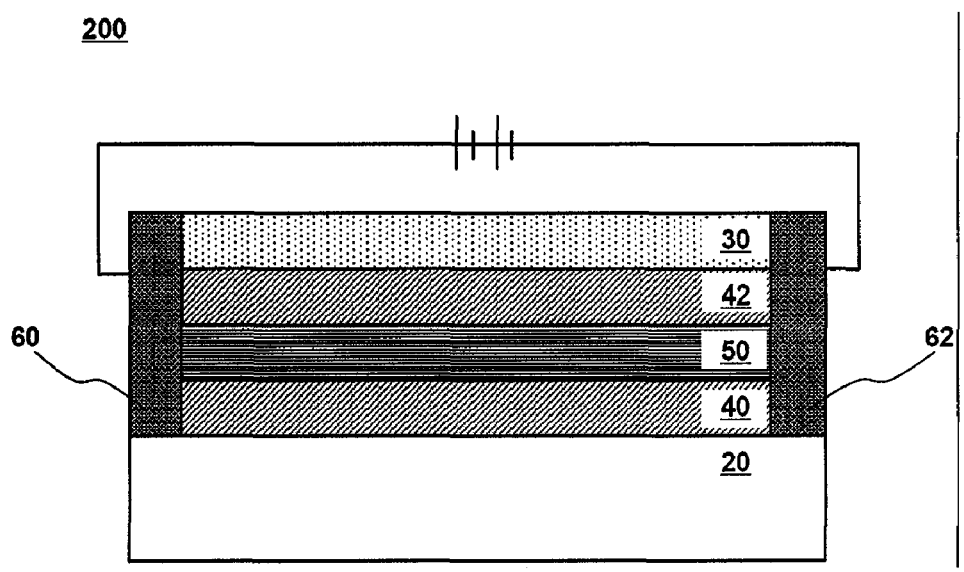
FIG. 7 to FIG. 11 show schematic diagrams illustrating specimens having the basic structure of FIG. 1, composing a structure of base layer/first dielectric layer/conductive layer/second dielectric layer/heat treatment-requiring material according to second embodiment, and connecting an electrode to the conductive layer and heat treatment-requiring material.
Figure 8:
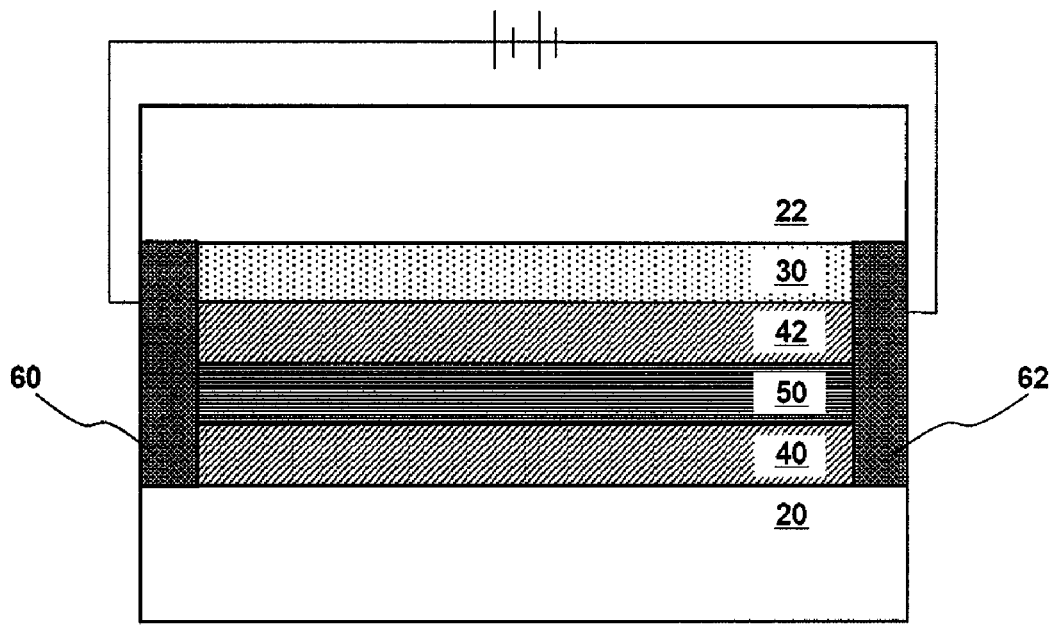
Figure 11:
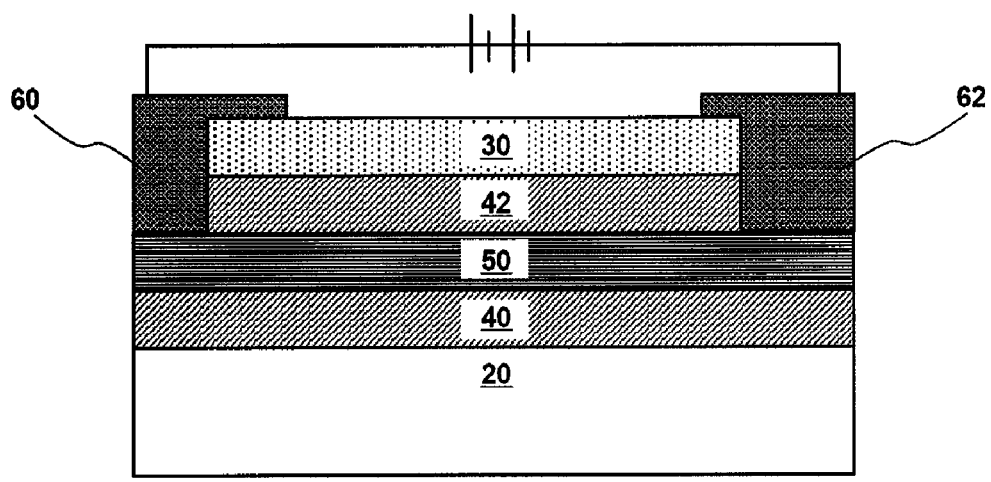

Specimens (200, 201,204) according to FIG. 7, FIG. 8 and FIG. 11 comprise a layered structure of the base layer (20), first dielectric layer (40), conductive layer (50), second dielectric layer (42) and target layer (30), and the electrodes (60, 62) formed in where made by removing some parts of both sides of first dielectric layer (40), conductive layer (50), second dielectric layer (42) and target layer (30) or where made by removing some parts of both sides of second dielectric layer (42) and target layer (30). Wherein, the electrodes (60, 62) may be formed in a structure of covering some parts of both sides of upper surface in the outermost target layer (30) as shown in FIG. 11.

Figure 9:
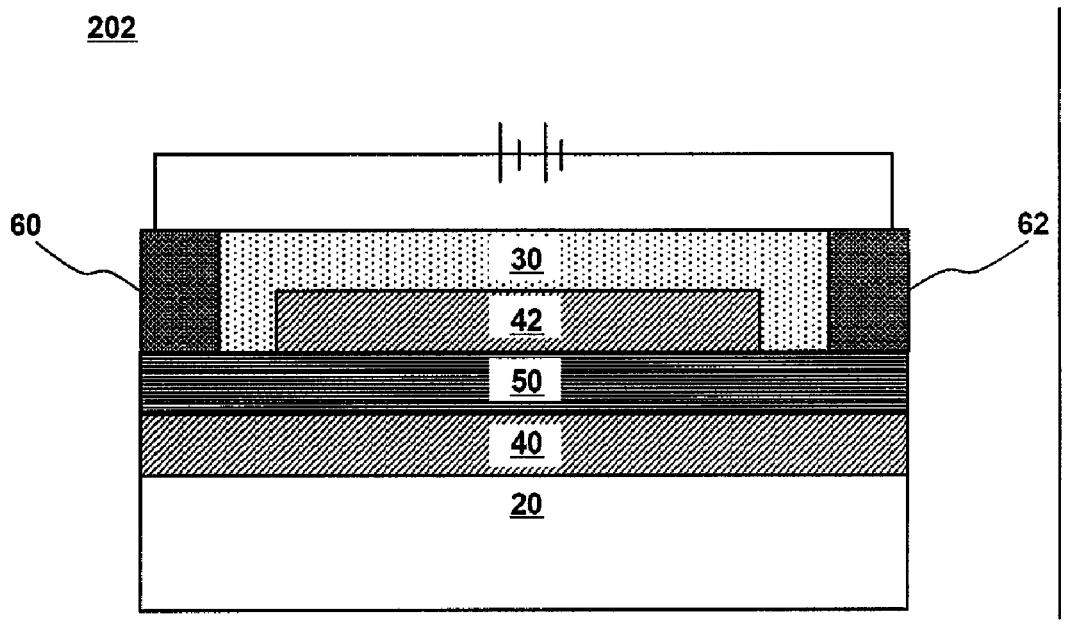

The Specimen (202) according to FIG. 9 comprise a layered structure of the base layer (20), first dielectric layer (40), conductive layer (50) and second dielectric layer (42), and the electrodes (60,62) formed in where made by removing some parts of both sides of target layer (30) in a state of which the target layer (30) is formed in a structure of covering on where made by removing some parts of both sides of second dielectric layer (42), whereby some parts of the target layer (30) make contact with the conductive layer (50).

Figure 10:
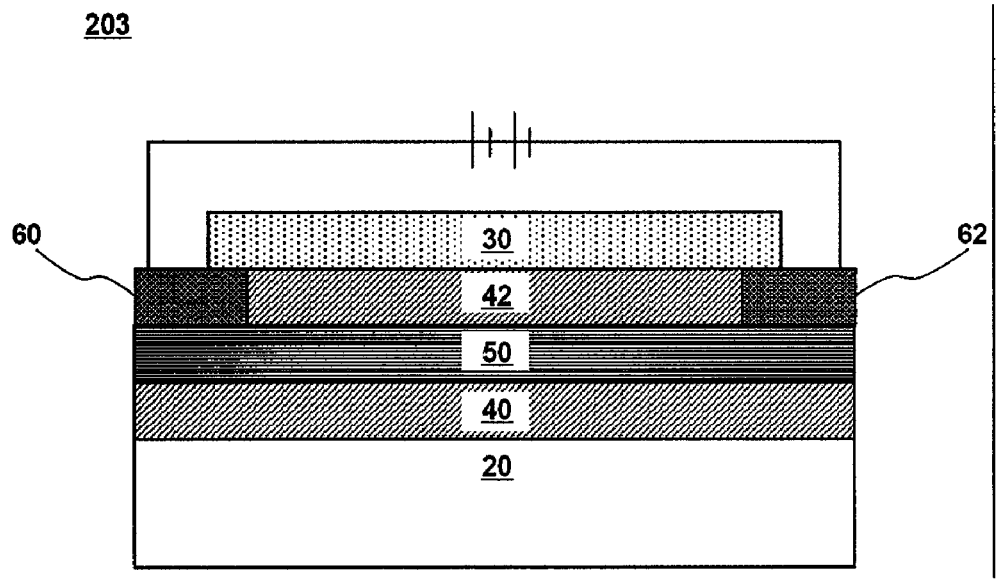

The specimen (203) according to FIG. 10 comprise a layered structure of the first dielectric layer (40), conductive layer (50) and second dielectric layer (42), and the electrodes (60, 62) are formed in where removing some parts of both sides of second dielectric layer (42) and then the target layer (30) are formed on the second dielectric layer (42) and electrode (60, 62).

Figure 12:
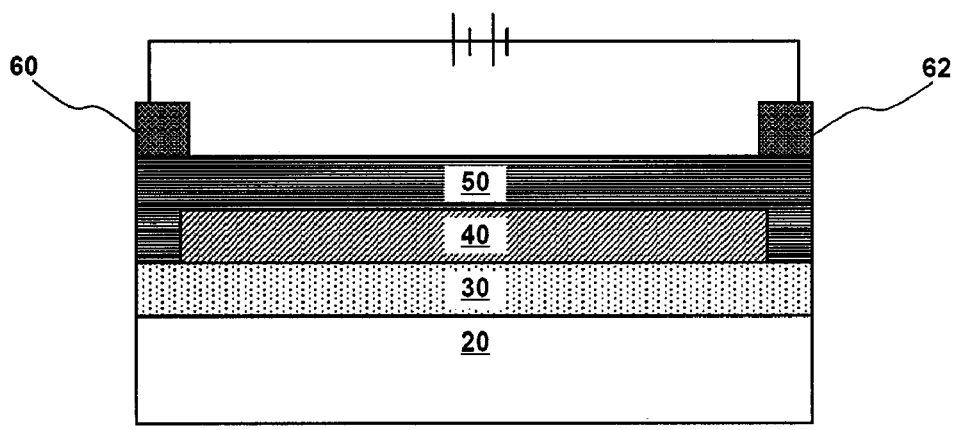
FIG. 12 to FIG. 13 show schematic diagrams illustrating specimens having the basic structure of FIG. 1, composing a structure of base layer/heat treatment-requiring material/dielectric layer/conductive layer according to third embodiment, making contact the heat treatment-requiring material with the conductive layer at least in some parts, and connecting an electrode to the conductive layer.
Figure 13:
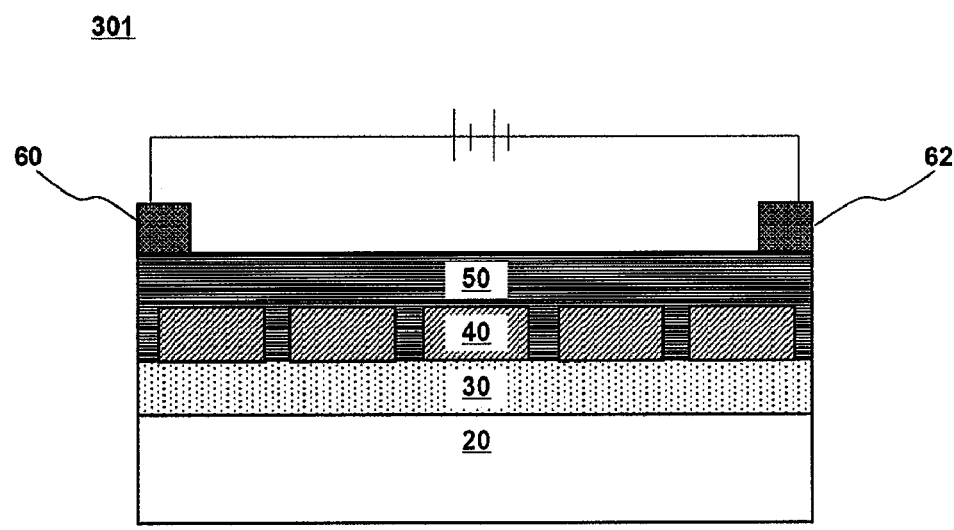

FIG. 12 and FIG. 13 describe schematic diagrams of specimens according to third embodiment of the present invention.

Specimens (300, 301) according to the third embodiment describe comprise that formed by application an electric field by connecting the electrodes (60, 62) only to the conductive layer (50) in a state of making contact the target layer (30) with conductive layer (50) each other at least in a part.

More specifically, specimens (300,301) according to the FIG. 12 and FIG. 13 comprise a layered structure of the base layer (20), target layer (30), dielectric layer (40) and conductive layer (50), and an electrode (60,62) formed on both sides of upper surface of the conductive layer (50). The conductive layer (50) makes contact in a part with the target layer (30) through the place made by partially removing the dielectric layer (40). For these partial contact between the conductive layer (50) and target layer (30), are formed by for example, removing some parts of both sides of dielectric layer (40), and then forming the conductive layer (50) in a structure of covering thereon, as shown in FIG. 12, or removing intermittently some parts of dielectric layer (40) with a specific pattern, and then forming the conductive layer (50) on the dielectric layer (40) to contact with the target layer (30) as shown in FIG. 13.

Figure 14:
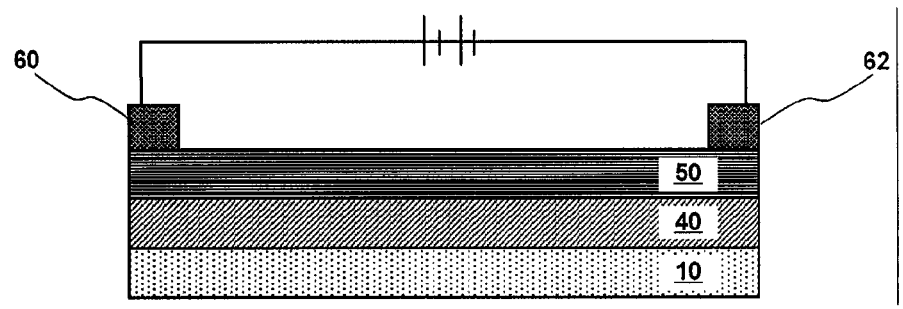
FIG. 14 shows a schematic diagram illustrating the constitution of annealing process in a state of making the dielectric breakdown voltage of dielectric layer high, as a basic structure according to another embodiment of the invention.

FIG. 14 describes a schematic diagram of another basic structure of specimens of the present invention.

Referring to the FIG. 14, the electrodes (60, 62) is not directly connected to the heat treatment-requiring material (10), but connected to only the conductive layer (50), and between the heat treatment-requiring material (10) and conductive layer (50), the dielectric layer (40) having higher dielectric breakdown voltage than potential difference between them is formed.

The dielectric breakdown voltage can be made higher by increasing the thickness of dielectric layer (40) or using dielectric material with high dielectric breakdown intensity. The structure may be applied to a case that is generally difficult to connect the electrodes with the heat treatment-requiring material (10), or a case that since a conductivity of the heat treatment-requiring material (10) itself is excellent, localized annealing is not easy when applying an electric field directly.

Figure 15:
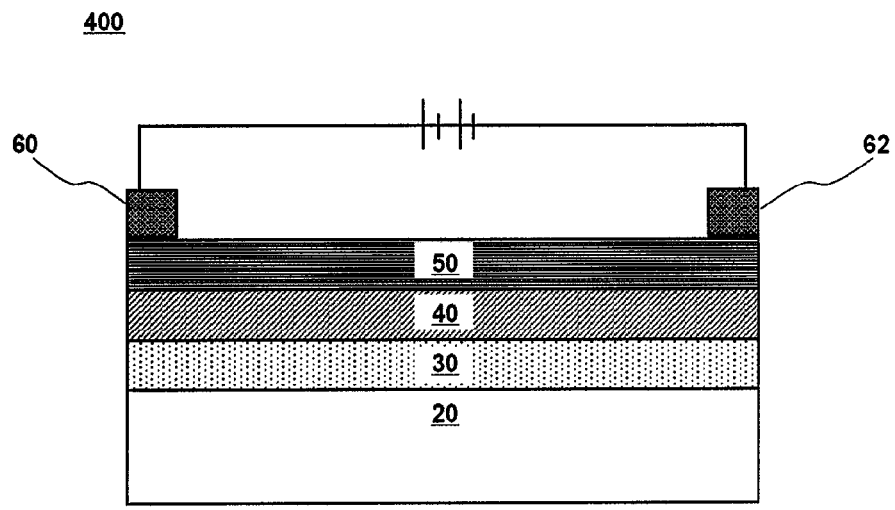
FIG. 15 to FIG. 17 show schematic diagrams illustrating specimens having the basic structure of FIG. 14 and a state of making the dielectric breakdown voltage of dielectric layer high according to desirable embodiments.
Figure 16:
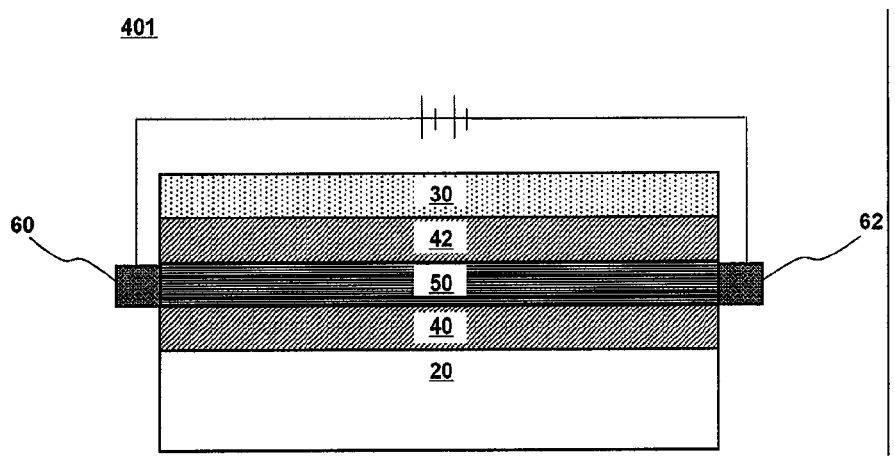
Figure 17:
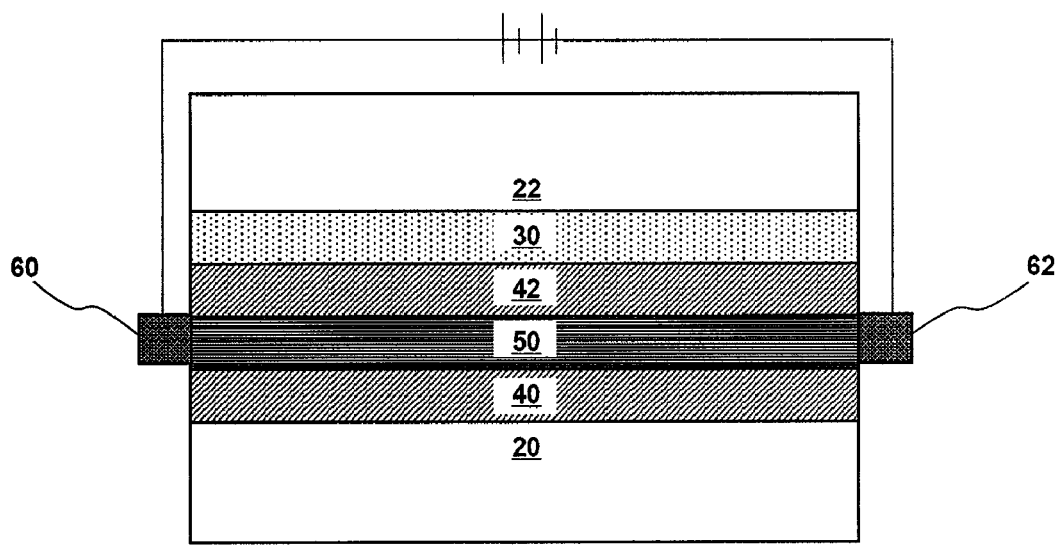
Figure 18:
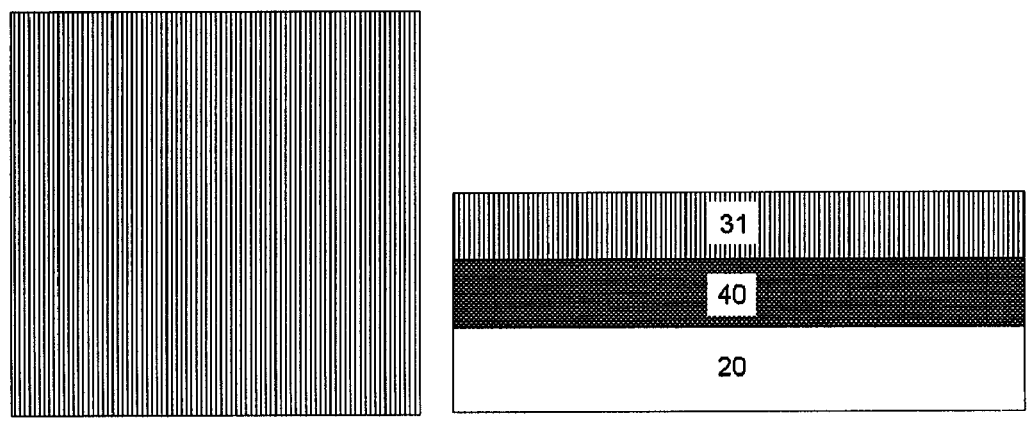
FIG. 18 to FIG. 22 show stage diagrams illustrating the manufacturing process of top gate transistor according to one embodiment of the invention.

FIG. 15 to FIG. 17 describe schematic diagrams illustrating specimens conducting annealing with a state of making high the dielectric breakdown voltage of dielectric layer, according to preferable embodiments having structure of the FIG. 14 as a basis structure. Wherein, one or two base layer(s) not requiring annealing due to the character of process may be added to these specimens (400, 401, 402), and the heat treatment-requiring material of these specimens (400, 401, 402) may be added in a form of layer, i.e. annealing target layer.

Specimens (400, 401, 402) according to the preferable examples, comprise a structure formed in order of the target layer (30), dielectric layer (40) and conductive layer (50) on the base layer (20), or in order of the first dielectric layer (40), conductive layer (50), second dielectric layer (42) and target layer (30) on the base layer (20), and include the electrodes (60, 62) connected to both sides of upper surface of the conductive layer (50). As to cases, additional base layer (20) may be added on the target layer (30) as shown in FIG. 17.

The specimen (400) according to FIG. 15 comprise a structure that base layer (20), target layer (30), dielectric layer (40) and conductive layer (50) are layered and the electrodes (60, 62) are formed to both sides of upper surface of conductive layer (50). The specimen (401) according to FIG. 16 comprise a structure of base layer (20), first dielectric layer (40), conductive layer (50), second dielectric layer (42) and target layer (30) are layered, and the electrodes (60, 62) are formed to both sides of conductive layer (50).

The annealing method according to the present invention may be applied variously without any limitation if it is a structure of the dielectric layer to be interposed between a heat treatment-requiring material and a conductive layer.

As to cases, the method may include pre-heating process of the heat treatment-requiring material within an allowable range of temperature, before electric field application to the conductive layer. Wherein, the allowable range of temperature means a temperature range in which the deformation of heat treatment-requiring material is not generated, for example, in case of carrying out annealing process to silicon thin film in substrate on which the silicon thin film and dielectric layer are formed in order, it may be the temperature range in which deformation of the substrate is not generated during the process. The method of pre-heating is not particularly limited, and for example, methods such as subjecting to a general heat treatment furnace, irradiating radiant heat of a lamp or the like may be used.

The heat treatment-requiring material of the present invention is not particularly limited in a form to be included in a mixed structure if it is a form of contacting with dielectric layer, and a representative example may be what added in a form of one or more than two layer(s) on dielectric layer.

A kind of the heat treatment-requiring material, dielectric layer, conductive layer and base layer is not particularly limited, in one a preferred embodiment, the annealing method of the invention is used for crystallization of an amorphous silicon thin film, an amorphous/polycrystalline mixed-stage silicon thin film, or a polycrystalline silicon thin film; or dopant activation and/or crystallization of a doped amorphous silicon thin film, a doped amorphous/polycrystalline mixed-stage silicon thin film, or a doped polycrystalline silicon thin film.

In such examples, the heat treatment-requiring material may be a doped or non-doped amorphous silicon thin film, an amorphous/polycrystalline mixed-stage silicon thin film or a polycrystalline silicon thin film, which is formed on a transparent substrate which optionally includes the dielectric layer formed thereon.

The rapid annealing method of the invention is applied preferably in a process for crystallization of a silicon thin film.

In one preferable embodiment, the crystallization method of silicon thin film according to the present invention comprises the steps:

forming an active layer of amorphous silicon state on a dielectric layer disposed on a transparent substrate;

forming a gate electrode with a gate dielectric layer being disposed on the active layer;

forming source and drain regions doped with impurity at the predetermined portion of the active layer;

forming a protect layer on the top surface of thus prepared substrate including the gate electrode, except for a portion where electrodes will be formed at both ends of the substrate;

performing the photo-lithograph about the protect layer to expose the source and drain regions;

forming a conductive layer on the top surface of thus prepared substrate; and applying an electric field to the conductive layer to anneal the active layer by means of the heat generated from the conductive layer.

In another preferable embodiment, the crystallization method of silicon thin film according to the present invention comprises the steps:

forming a gate electrode on the substrate;

forming a first dielectric film on the top surface of thus prepared substrate, except for a portion where electrodes will be formed at both ends of the gate electrode;

deposing an amorphous silicon thin film and a doped amorphous silicon thin film successively on the first dielectric film;

forming a conductive layer on the top surface of thus prepared substrate including the both ends of the gate electrode;

applying an electric field to the conductive layer to crystallize the amorphous silicon thin film and doped amorphous silicon thin film by means of the heat generated from the conductive layer.

In above embodiments of crystallization of silicon thin film, the substrate may be a glass substrate or a plastic substrate, the conductive layer may be an ITO thin film, a transparent conductive film of other types, or a metallic thin film, and the dielectric layer may be a silicon oxide layer or a silicon nitride layer In another preferable embodiment, the rapid annealing method may be applied to the process of dopant activation when forming a shallow junction or an ultra shallow junction of a semiconductor device. In this case, the heat treatment-requiring material, for example, may be a single-crystalline silicon wafer, which is ion-implanted with a low energy, or an epitaxial wafer, which is formed by growing another single-crystalline film on a silicon wafer.

As the degree of integration of device goes rising recently, the ultra shallow junction is required according to a design rule of device, whereby the maximum concentration layer of dopant exists in the vicinity of silicon substrate surface such as existing within hundreds of Å from the surface of silicon substrate. The junction depth is increased due to diffusion of the dopant layer by going through a followed annealing process after implanting Boron ion. Therefore, the RTA (Rapid Thermal Annealing) method having a rapid heating rate, i.e., the Spike-annealing method (400° C./sec) is attempting. However, the rapid annealing method ($>10^{6}$° C./sec) according to the present invention can be used preferably in the ultra shallow junction process, because when conducting the activation of ultra shallow junction by using the rapid annealing method, not only the above problems can be solved dramatically, but also the deformation of silicon wafer can be prevented.

For example, the ultra shallow junction process according to the present invention may be comprise the steps: preparing field oxide film on a silicon wafer for device separation, then forming gate oxide film, gate electrode and spacer oxide film in sequence, and doping the surface of silicon wafer by ion-implanting such as 11B or 49BF$_2$ ion using high electric current ion implanters to form source/drain. Then, preparing dielectric layer to prevent contamination and forming a conductive layer thereon and conducting a rapid annealing process by applying an electric field to the conductive layer, whereby the source/drain conjunction can be accomplished by activating dopants of the doping scope.

Hereinafter, several specific embodiments concerning application method of the silicon thin film will be described in more detail with reference to drawings, which are not intended to limit the scope of the invention by any means.

Figure 23:
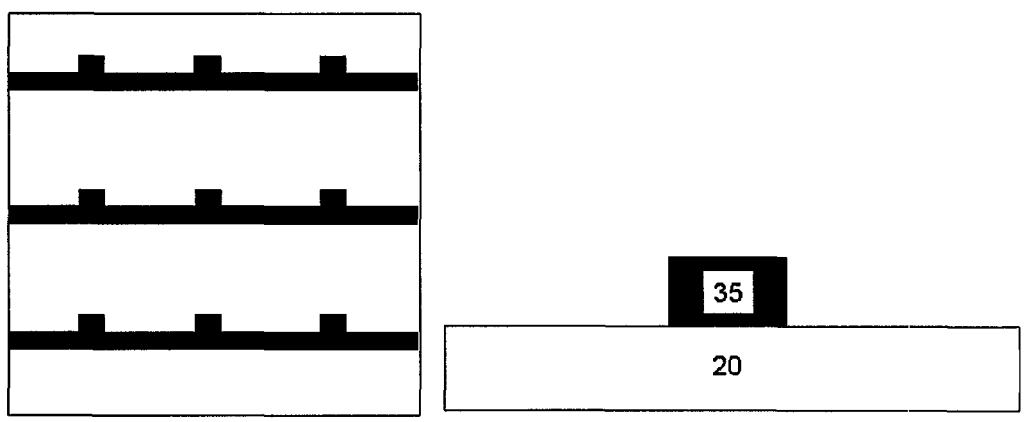
FIG. 23 shows a schematic diagram illustrating the structure of top gate transistor.
Figure 24:
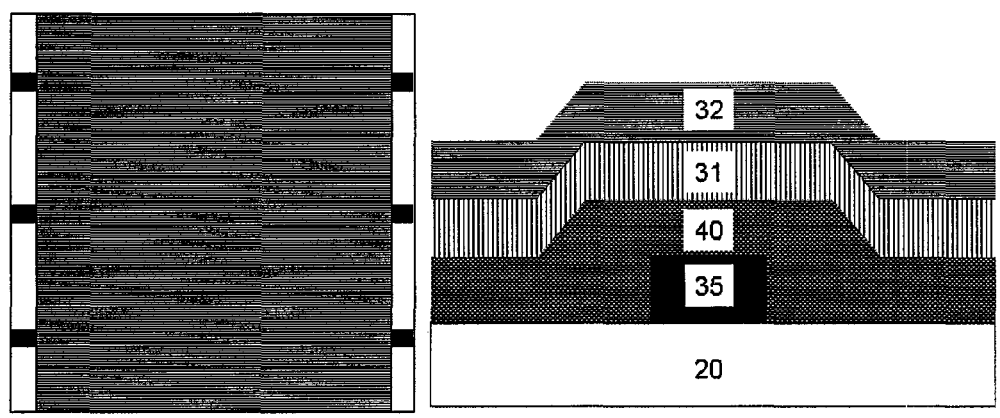

FIG. 18 to FIG. 22 describe stage diagrams illustrating a manufacturing process of top gate transistor according to one embodiment of the invention, and FIG. 23 describes a structure of top gate transistor produced by the process.

Figure 19:
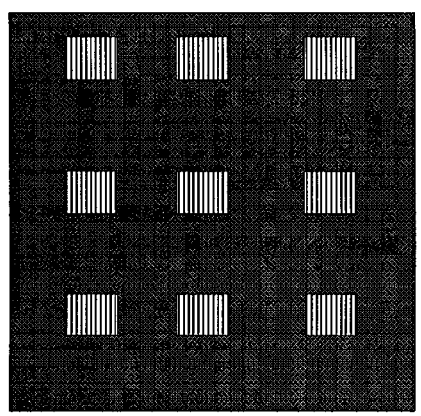
Figure 19:
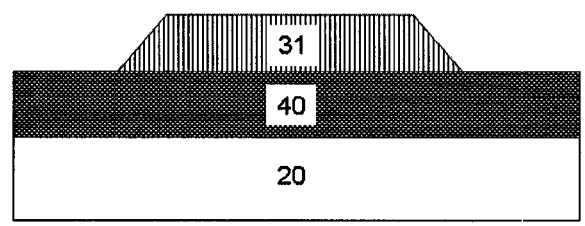
Figure 20:
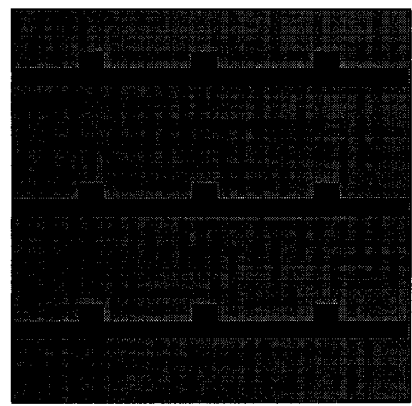
Figure 20:
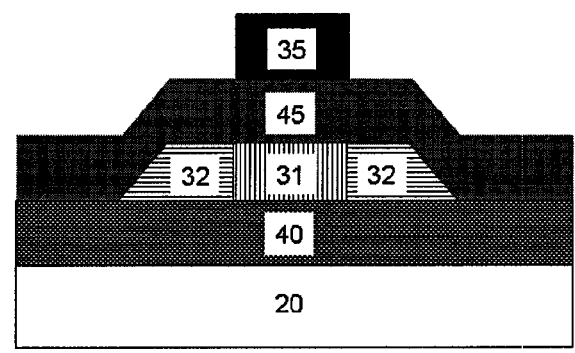
Figure 21:
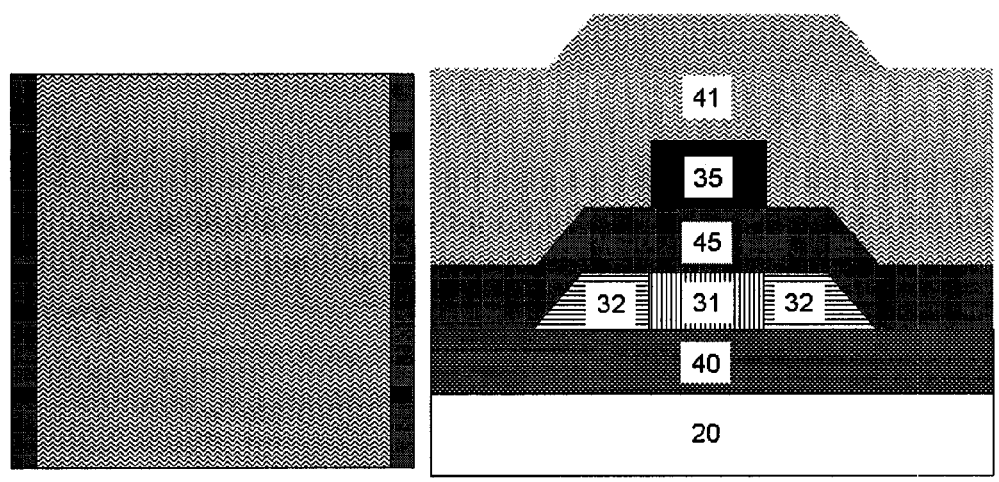
Figure 22:
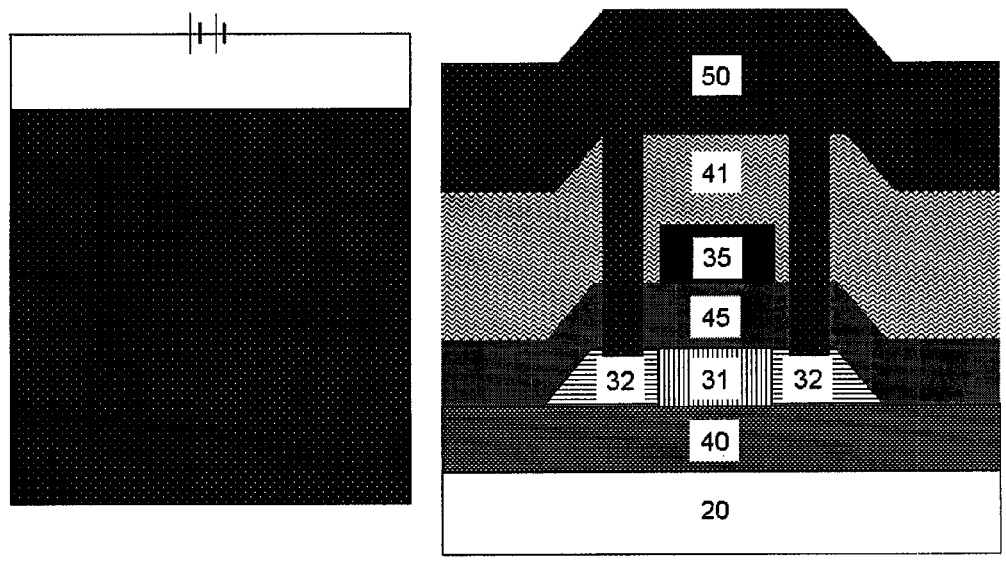

Referring to these drawings, after depositing an amorphous silicon thin film (31) on a substrate (20) with dielectric layer (40) to be interposed (referring FIG. 18), a patterning process for individual TFT devices is accomplished by a lithography process (FIG. 19). The gate oxide film (45) is deposited by the PECVD method thereon, and then the gate electrode (35) is deposited by sputtering. In order to form the gate electrode (35), the patterning is performed by a lithography process and etching process. On thus prepared self-aligned gate structure, the source and drain (32) is formed by ion-implanting a dopant (referring FIG. 20). Then, the passivation layer (41) is formed in a state of which the both ends of the aligned gate line are exposed (referring FIG. 21), and then exposing the source/drain (32) by using a photo etching process, overall depositing the conductive layer (50) thereon to be contact with both ends of the aligned gate line (referring FIG. 22). In a structure formed by this method, the crystallization and dopant activation are carried out simultaneously without generation of arc by applying an electric field to the conductive layer (50).

FIG. 23 to FIG. 26 describes stage diagrams illustrating a manufacturing process of bottom gate as another embodiment of the present invention.

Figure 25:
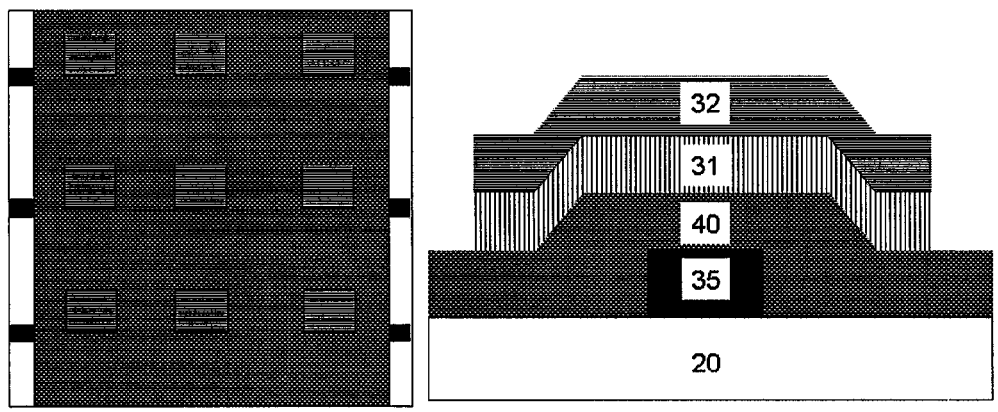
Figure 26:
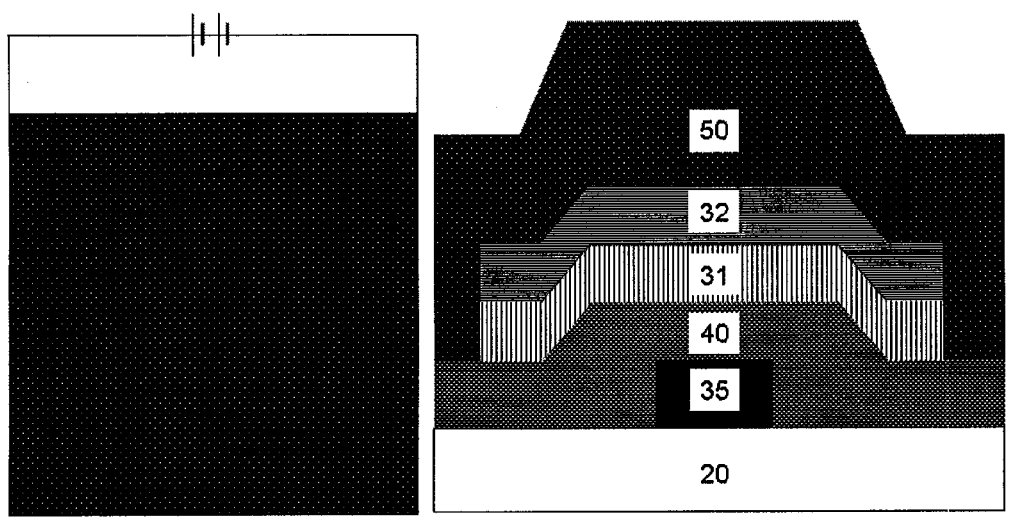

Referring to these drawings, the gate line (35) is formed on the substrate (20) (referring FIG. 23), then dielectric layer (40), the amorphous silicon thin film (31) and doped amorphous silicon thin film (32) are formed in sequence to be exposed the both ends of gate line (35) (referring FIG. 24), and the patterning process with respect to individual TFT devices is accomplished by a lithography process (referring FIG. 25). Then, the conductive layer (50) is formed on entire surface of substrate to be connected to the exposed gate line (35) (referring FIG. 26). In a structure formed by this method, the crystallization in a structure of bottom gate is carried out without generation of arc by applying an electric field to the conductive layer (50).

EXAMPLES

Hereinafter, the experiments conducted by the inventors will be described in detail with reference to Examples, which are not intended to limit the scope of the invention by any means.

Example 1

After forming a $SiO_2$ layer (first dielectric layer) having a thickness of 3000 Å by using the PECVD method on a glass substrate having a size of 3 cm in width×2 cm in length×0.7 mm in thickness, an amorphous silicon thin film having a thickness of 500 Å was deposited. Then, after depositing a $SiO_2$ layer (second dielectric layer) having a thickness of 1000 Å thereon by using the PECVD method again, etching $SiO_2$ layer partially in position of the electrodes to be deposited. On thus prepared structure, an ITO thin film (conductive layer) having a thickness of 1000 Å was deposited by using sputtering method, and then the electrodes having 0.5 cm in length are formed in both ends of not only the conductive layer, but also an amorphous silicon thin film to flow an electric current, thereby preparing the specimen as shown in FIG. 3. Resistance of the conductive layer was measured to be 12Ω.

Figure 27:
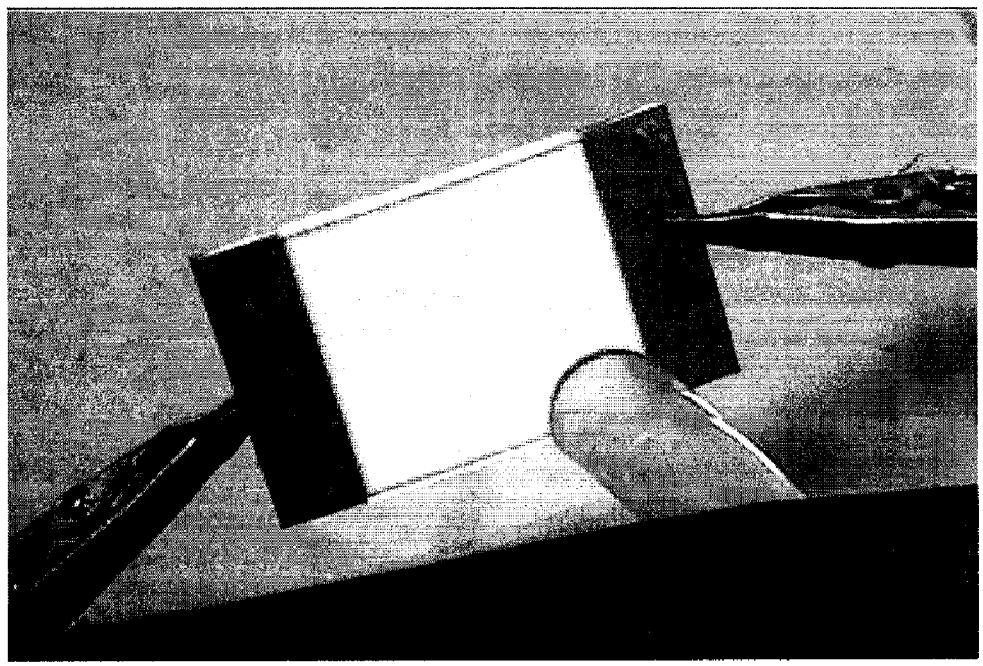
FIG. 27 shows a photograph showing the feature of specimen emitting light by Joule heating by application of first electric field in Example 1 of the invention.
Figure 28:
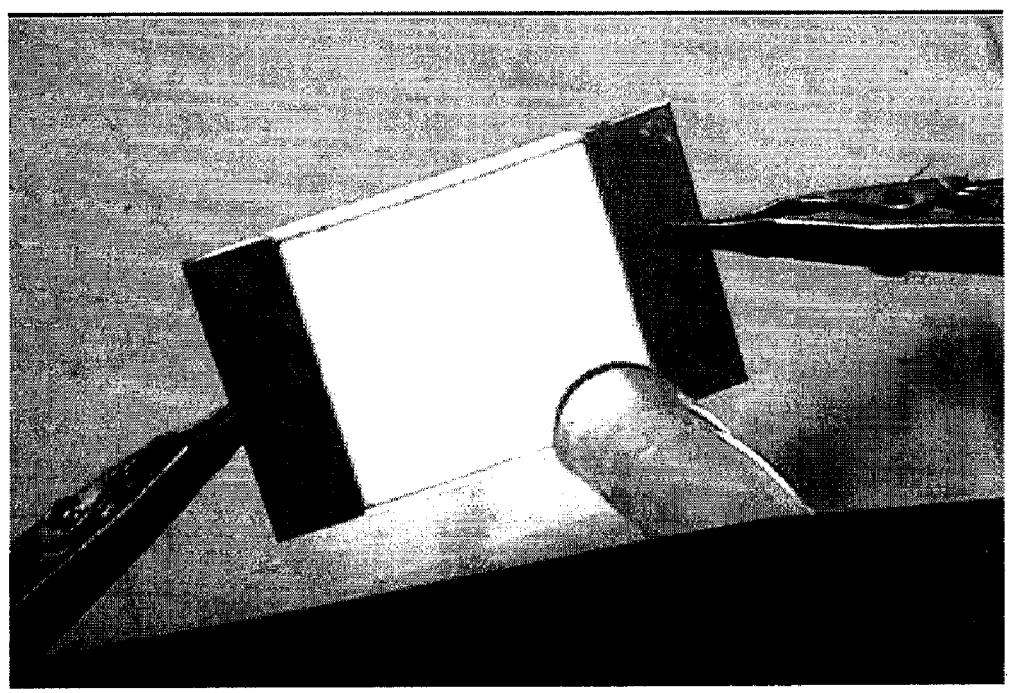
FIG. 28 shows a photograph showing the feature of specimen emitting light by Joule heating by application of second electric field in Example 1 of the invention.

The electric current was applied to the electrodes of thus prepared specimen in a condition of 300 V-20 ms. The amorphous silicon was crystallized by high heating temperature during the first electric field application, and the luminescence phenomena caused by Joule heating during the first electric field application is disclosed in FIG. 27. Although during the second electric field application, the luminescence phenomena caused by Joule heating due to applying the electric field was observed as shown in FIG. 28, it can be seen that the arc was not generated at the edge of the crystallized silicon. Namely, the silicon thin film having conductivity according to heating was connected to the electrode, whereby it is in an equipotential state with the conductive layer. Therefore, the potential difference in the direction of thickness of dielectric layer does not exist, thus the dielectric breakdown of $SiO_2$ dielectric layer was not occurred.

Example 2

After forming a $SiO_2$ layer (first dielectric layer) having a thickness of 3000 Å by the PECVD method on a glass substrate having a size of 3 cm in width×2 cm in length×0.7 mm in thickness, an amorphous silicon thin film having a thickness of 500 Å was deposited. Then, a $SiO_2$ layer (second dielectric layer) having a thickness of 1 μm was deposited by the PECVD method. Then, an ITO thin film (conductive layer) having a thickness of 1000 Å was deposited on the second dielectric layer by sputtering thereby preparing a specimen as shown in FIG. 14. Resistance of the conductive layer was measured to be 12Ω.

Figure 29:
FIG. 29 shows a photograph showing the feature of specimen emitting light by Joule heating by application of first electric field in Example 2 of the invention.
Figure 30:
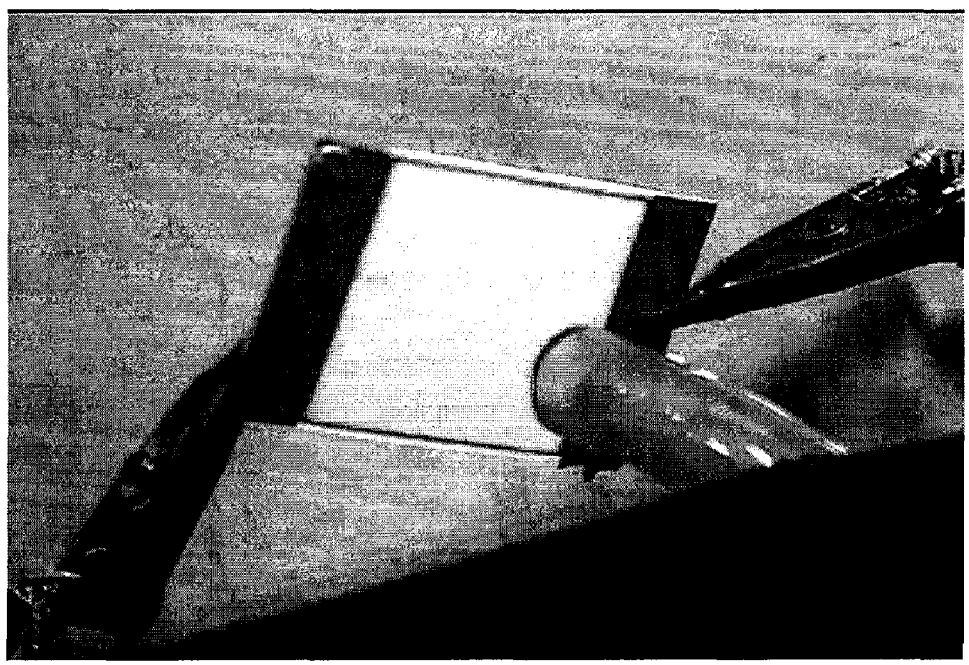
FIG. 30 shows a photograph showing the feature of specimen emitting light by Joule heating by application of second electric field in Example 2 of the invention.

The electric current was applied in a condition of 300 V-20 ms to the conductive layer of thus prepared specimen. The amorphous silicon was crystallized by high heating temperature due to application of a first electric field; and the luminescence phenomena caused by Joule heating during the first electric field application shows in FIG. 29. Although the luminescence phenomena caused by Joule heating during the second electric field application was observed as shown in FIG. 30, it can be seen that the arc was not occurred at the edge of crystalline silicon.

Namely, when the second electric field application in a structure of conductive layer/dielectric layer/silicon thin film, the silicon thin film is in a state of crystallization, and the silicon reached to a very high temperature during Joule heating of the conductive layer is in a state of conductor. Accordingly, the structure is become temporarily in a state of conductor/dielectric layer/conductor during Joule heating.

In the experiment of this Example, an electric field was applied only to the conductive layer, thus a potential difference between the conductive layer and silicon which is become a conductor temporarily is occurred with the value of 300V maximum. Accordingly, the maximum potential difference is applied on edge of the dielectric layer, and wherein because the 300 V of potential difference is occurred when $SiO_2$ dielectric layer has 1 μm of thickness, an electric field applied in the direction of thickness of dielectric layer has a value of $3.0 \times 10^6$ V/cm. Although the intensity of dielectric breakdown of $SiO_2$ dielectric layer is changed by the method of deposition, and the maximum intensity of dielectric breakdown is about $10^7$ V/cm, therefore since the condition of this experiment did not exceed the intensity of dielectric breakdown of SiO$_2$ dielectric layer, the dielectric breakdown did not occur.

Comparative Example 1

After forming a SiO$_2$ layer (first dielectric layer) having a thickness of 3000 Å by using the PECVD method on a glass substrate having a size of 3 cm in width×2 cm in length×0.7 mm in thickness, an amorphous silicon thin film having a thickness of 500 Å was deposited. A SiO$_2$ layer (second dielectric layer) having a thickness of 1000 Å was deposited thereon by the PECVD method, and an ITO thin film (conductive layer) having a thickness of 1000 Å was deposited on the second dielectric layer by sputtering, then the electrode having 0.5 cm in length was formed at both ends thereof, thereby preparing a specimen. Resistance of the conductive layer was measured to be 12Ω.

Figure 31:
FIG. 31 shows a photograph showing the feature of arc occurred due to application of an electric field in Comparative Example 1 of the invention.

The electric current was applied in a condition of 700 V-1 ms to the conductive layer of thus prepared specimen. The amorphous silicon was crystallized by high heating temperature during an electric field application. However, as shown in FIG. 31, it can be seen that the arc was occurred at the edge of the crystallized silicon.

This is because the thickness of second dielectric layer is not strong enough to prevent the potential difference of conduction layer/dielectric layer/silicon due to not forming the equipotential structure as shown in Example 1. Namely, in a structure of conductive layer/dielectric layer/silicon thin film, the silicon reached at very high heating temperature during Joule heating of the conductive layer is crystallized and become a state of conductor simultaneously. Thus, the structure of thin film is temporarily become in a state of conductor/dielectric layer/conductor during Joule heating.

In this experiment, an electric field was applied only to the conductive layer, thus a potential difference between the conductive layer and silicon which is become a conductor temporarily is occurred with the value of 300V maximum. Accordingly, the maximum potential difference is applied on edge of the silicon. The thickness of SiO$_2$ dielectric layer occurring 300 V of potential difference is 1000 Å, thus the electric field applied in the direction of thickness of dielectric layer has a value of 2.5×10$^7$ V/cm. Although the intensity of dielectric breakdown of SiO$_2$ dielectric layer changes according to the method of depositing, the maximal intensity of dielectric breakdown is about 10$^7$ V/cm. Although the intensity of dielectric breakdown of SiO$_2$ dielectric layer is changed by the method of deposition, and the maximum intensity is about 10$^7$ V/cm. therefore, since the condition of this experiment exceeds the intensity of dielectric breakdown of SiO$_2$ dielectric layer, the dielectric breakdown occurred and the arc was accompanied.

Example 3

A silicon wafer having a size of 3 cm in width×2 cm in length×0.7 mm in thickness was doped with Boron by using the ion implant method. And then, a SiO$_2$ layer (dielectric layer; 40) having a thickness of 1 μm was deposited using the PECVD method as seen in FIG. 14. Then an ITO thin film (conductive layer; 50) having a thickness of 1000 Å was deposited thereon by sputtering, and thereby preparing the specimen. Resistance of the conductive layer was measured to be 12Ω.

The electric current was applied in a condition of 300 V-20 ms to the conductive layer of thus prepared specimen. The dopant of the silicon wafer was activated by high heating temperature during the first electric field application.

In this experiment, an electric field was applied only to the conductive layer, thus a potential difference between the conductive layer and silicon which is become a conductor temporarily is occurred with the value of 300V maximum. Accordingly, the maximum potential difference is applied on edge of the dielectric layer, and wherein because the 300 V of potential difference is occurred when SiO$_2$ dielectric layer has 1 μm of thickness, an electric field applied in the direction of thickness of dielectric layer has a value of 3.0×10$^6$ V/cm. Although the intensity of dielectric breakdown of SiO$_2$ dielectric layer is changed by the method of deposition, and the maximum intensity of dielectric breakdown is about 10$^7$ V/cm, therefore since the condition of this experiment did not exceed the intensity of dielectric breakdown of SiO$_2$ dielectric layer, the dielectric breakdown did not occur.

Various modifications and applications on the basis of the above description will be possible to those ordinarily skilled in the art.

INDUSTRIAL APPLICABILITY

As described above, the annealing method according to the present invention can prevent the arc occurred by the dielectric breakdown of dielectric layer in annealing selectively a heat treatment-requiring material by Joule heating due to a electric field application, thus provides the following effect;

First, a rapid annealing at a high temperature to the desired parts only with minimizing influences to the surroundings can be achieved.

Second, controlling of the heating rate and annealing time is unrestricted. Especially, heating to high temperature is possible in an extremely short time.

Third, the accurate temperature replicability reproducibility and temperature uniformity can be achieved.

Fourth, it is clean due to using electricity and the cost of maintenance and equipments is inexpensive.

Various modifications and applications on the basis of the above description will be possible to those ordinarily skilled in the art.

What is claimed is:

1. A rapid annealing method in a mixed structure composed of a heat treatment-requiring material, dielectric layer and conductive layer, comprising
   generating a heat due to Joule heating by applying an electric field to the conductive layer; and
   annealing a desired part of the heat treatment-requiring material by the heat,
   wherein a potential difference between the heat treatment-requiring material and the conductive layer is set lower than the dielectric breakdown voltage of the dielectric layer by (i) making the potential difference between the heat treatment-requiring material and conductive layer lower then the dielectric breakdown voltage of the dielectric layer during Joule heating, or (ii) raising the dielectric breakdown voltage of the dielectric layer.

2. The rapid annealing method according to claim 1, wherein the heat treatment-requiring material contains a material having conductivity or a material becoming to have conductivity during the annealing.

3. The rapid annealing method according to claim 1, wherein the equipotential is made not to occur the potential difference between the conductive layer and heat treatment-requiring material by applying an electric field to both the conductive layer and the heat treatment-requiring material.

4. The rapid annealing method according to claim 3, wherein, in case where the structure is composed of the heat treatment-requiring material/dielectric layer/conductive layer, both the heat treatment-requiring material and conductive layer are connected to an electrode; or some parts of the heat treatment-requiring material and conductive layer are connected by contact each other; or an optional connection member is added temporarily to connect electrically the heat treatment-requiring material with the conductive layer only when applying an electric field.

5. The rapid annealing method according to claim 4, wherein in case where the structure is composed of the conductive layer/dielectric layer/heat treatment-requiring material/dielectric layer/conductive layer, both the heat treatment-requiring material and the conductive layer are connected to an electrode; or some parts of the heat treatment-requiring material and conductive layer are connected by contact each other; or an optional connection member is added temporarily to connect electrically the heat treatment-requiring material with the conductive layer only when applying an electric field.

6. The rapid annealing method according to claim 4, wherein one or more than two base layer(s) not requiring heat treatment due to the characteristics of process is(are) further added.

7. The rapid annealing method according to claim 6, wherein the heat treatment-requiring material, dielectric layer and conductive layer are formed in sequence on the base layer, then some parts of the heat treatment-requiring material, dielectric layer and conductive layer are removed to form electrodes.

8. The rapid annealing method according to claim 6, wherein the heat treatment-requiring material, dielectric layer and conductive layer are formed in sequence on the base layer, then some parts of the dielectric layer and conductive layer are removed to form electrodes, and the electrodes make also contact with the heat treatment-requiring material.

9. The rapid annealing method according to claim 8, wherein the electrode is constructed in a structure of covering a part of both sides of upper surface of the conductive layer.

10. The rapid annealing method according to claim 6, wherein the heat treatment-requiring material and dielectric layer are formed in sequence on the base layer, then some parts of both sides of the dielectric layer are removed to form electrodes which make contact with the heat treatment-requiring material, and the conductive layer is formed on the dielectric layer and electrode, and followed by forming electrodes on both sides of upper or side surface of the conductive layer.

11. The rapid annealing method according to claim 6, wherein the heat treatment-requiring material and dielectric layer are formed in sequence on the base layer, then some parts of the dielectric layer are intermittently removed with a predetermined pattern to form electrodes which make contact with the heat treatment-requiring material, and the conductive layer is formed on the dielectric layer and electrode, and followed by forming electrodes on both sides of upper or side surface of the conductive layer.

12. The rapid annealing method according to claim 3, wherein in case where the structure is composed of the base layer/first dielectric layer/conductive layer/second dielectric layer/heat treatment-requiring material, electrodes are connected to both the heat treatment-requiring material and the conductive layer.

13. The rapid annealing method according to claim 12, wherein in case where the structure is composed of the base layer/first dielectric layer/conductive layer/second dielectric layer/heat treatment-requiring material/base layer, the electrodes are connected to both the heat treatment-requiring material and the conductive layer.

14. The rapid annealing method according to claim 12, wherein the first dielectric layer, conductive layer and second dielectric layer are formed in sequence on the base layer, then some parts of both sides of the second dielectric layer are removed, and the heat treatment-requiring material are formed on the second dielectric layer in a structure of covering the second dielectric layer, and followed by removing some parts of both sides of the heat treatment-requiring material to form the electrodes.

15. The rapid annealing method according to claim 12, wherein the first dielectric layer, conductive layer and second dielectric layer are formed in sequence on the base layer, then some parts of both sides of the second dielectric layer are removed to form the electrodes, followed by forming the heat treatment-requiring material on the second dielectric layer and electrodes.

16. The rapid annealing method according to claim 12, wherein the first dielectric layer, conductive layer, second dielectric layer and heat treatment-requiring material are formed in sequence on the base layer, then some parts of both sides of the second dielectric layer and heat treatment-requiring material are removed to form the electrodes.

17. The rapid annealing method according to claim 16, wherein the electrodes are formed in a structure of covering some parts of both sides of upper surface of the heat treatment-requiring material.

18. The rapid annealing method according to claim 3, wherein in case where the structure is comprised of the heat treatment-requiring material/dielectric layer/conductive layer, electrodes are connected to the conductive layer, and the heat treatment-requiring material and conductive layer are contacted each other at least in part.

19. The rapid annealing method according to claim 18, wherein one or two base layer(s) not requiring heat treatment due to the characteristics of process is(are) further added.

20. The rapid annealing method according to claim 19, wherein the heat treatment-requiring material and dielectric layer are formed in sequence on the base layer, some parts of both sides of the dielectric layer are removed, the conductive layer is formed on the dielectric layer in a structure of covering the dielectric layer, the electrodes are formed on both sides of upper surface of the conductive layer, and the conductive layer makes contact with the heat treatment-requiring material.

21. The rapid annealing method according to claim 19, wherein the heat treatment-requiring material and dielectric layer are formed in sequence on the base layer, some parts of the dielectric layer are intermittently removed with a predetermined pattern, the conductive layer is formed on the dielectric layer to make contact with the heat treatment-requiring material, and followed by forming the electrodes on both sides of upper or side surface of the conductive layer.

22. The rapid annealing method according to claim 1, wherein the thickness of the dielectric layer is increased to make the dielectric breakdown voltage of dielectric layer higher than the potential difference between the heat treatment-requiring material and conductive layer.

23. The rapid annealing method according to claim 22, wherein in case where the structure is comprised of the heat treatment-requiring material/dielectric layer/conductive layer, the electrodes are connected to the conductive layer.

24. The rapid annealing method according to claim 23, wherein one or two base layer(s) not requiring annealing due to the characteristics of process is(are) further added.

25. The rapid annealing method according to claim 24, wherein the heat treatment-requiring material, dielectric layer and conductive layer are formed in sequence on the base layer, then the electrodes are formed on both sides of upper or side surface of the conductive layer.

26. The rapid annealing method according to claim 24, wherein the first dielectric layer, conductive layer, second dielectric layer and heat treatment-requiring material are formed in sequence on the base layer, then the electrodes are formed on both sides of side surface of the conductive layer.

27. The rapid annealing method according to claim 24, wherein the first dielectric layer, conductive layer, second dielectric layer, heat treatment-requiring material and base layer are formed in sequence on the base layer, then the electrodes are formed on both sides of side surface of the conductive layer.

28. The rapid annealing method according to claim 1, wherein the method further includes a step of preheating the heat treatment-requiring material within an allowable temperature range thereof before application of an electric field to the conductive layer.

29. A rapid annealing method in a mixed structure composed of a heat treatment-requiring material, dielectric layer and conductive layer, the method comprising:
generating a heat due to Joule heating by applying an electric field to the conductive layer; and
annealing a desired part of the heat treatment-requiring material and the conductive layer is set lower than the dielectric breakdown voltage of the dielectric layer,
wherein the annealing method is used for crystallization of an amorphous silicon thin film, an amorphous/polycrystalline mixed-stage silicon thin film, or a polycrystalline silicon thin film; or dopant activation and/or crystallization of a doped amorphous silicon thin film, a doped amorphous silicon/polycrystalline mixed-stage silicon thin film, or a doped polycrystalline silicon thin film.

30. The rapid annealing method according to claim 1, wherein the heat treatment-requiring material is a doped or non-doped amorphous silicon thin film, an amorphous/polycrystalline mixed-stage silicon thin film or a polycrystalline silicon thin film, which is formed on a transparent substrate which optionally includes the dielectric layer formed thereon.

31. The rapid annealing method according to claim 29, wherein the method is applied to the crystallization of silicon thin film, and the method comprises the steps:
forming an active layer of amorphous silicon state on a dielectric layer disposed on a transparent substrate;
forming a gate electrode with a gate dielectric layer being disposed on the active layer;
forming source and drain regions doped with impurity at the predetermined portion of the active layer;
forming a protect layer on the top surface of thus prepared substrate including the gate electrode, except for a portion where electrodes will be formed at both ends of the substrate;
performing the photo-lithograph about the protect layer to expose the source and drain regions;
forming a conductive layer on the top surface of thus prepared substrate; and
applying an electric field to the conductive layer to anneal the active layer by means of the heat generated from the conductive layer.

32. The rapid annealing method according to claim 29, wherein the method is applied to crystallization of silicon thin film, and the method comprises the steps:
forming a gate electrode on the substrate;
forming a first dielectric film on the top surface of thus prepared substrate, except for a portion where electrodes will be formed at both ends of the gate electrode;
deposing an amorphous silicon thin film and a doped amorphous silicon thin film successively on the first dielectric film;
forming a conductive layer on the top surface of thus prepared substrate including the both ends of the gate electrode;
applying an electric field to the conductive layer to crystallize the amorphous silicon thin film and doped amorphous silicon thin film by means of the heat generated from the conductive layer.

33. The rapid annealing method according to claim 31, wherein the substrate is a glass substrate or a plastic substrate, the conductive layer is an ITO thin film, a transparent conductive film of other types, or a metallic thin film, and the dielectric layer is a silicon oxide layer or a silicon nitride layer.

34. A rapid annealing method in a mixed structure composed of a heat treatment-requiring material, dielectric layer and conductive layer, the method comprising;
generating a heat due to Joule heating by applying an electric field to the conductive layer; and
annealing a desired part of the heat treatment-requiring material by the heat,
wherein a potential difference between the heat treatment-requiring material and the conductive layer is set lower than the dielectric breakdown voltage of the dielectric layer,
wherein the annealing method is used for forming an ultra shallow junction of semiconductor device.

35. A rapid annealing method in a mixed structure composed of a heat treatment-requiring material, dielectric layer and conductive layer, the method comprising:
generating a heat due to Joule heating by applying an electric field to the conductive layer; and
annealing a desired part of the heat treatment-requiring material by the heat,
wherein a potential difference between the heat treatment-requiring material and the conductive layer is set lower than the dielectric breakdown voltage of the dielectric layer,
wherein the heat treatment-requiring material is an ion implanted silicon wafer with the low accelerating voltage.

36. The rapid annealing method according to claim 32, wherein the substrate is a glass substrate or a plastic substrate, the conductive layer is an ITO thin film, a transparent conductive film of other types, or a metallic thin film, and the dielectric layer is a silicon oxide layer or a silicon nitride layer.

* * * * *